United States Patent
Rambach

(10) Patent No.: US 10,501,311 B2
(45) Date of Patent: Dec. 10, 2019

(54) MICROMECHANICAL DEVICE HAVING A FIRST CAVITY AND A SECOND CAVITY

(71) Applicant: Robert Bosch GmbH, Stuttgart (DE)

(72) Inventor: Martin Rambach, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/012,391

(22) Filed: Jun. 19, 2018

(65) Prior Publication Data

US 2018/0370791 A1 Dec. 27, 2018

(30) Foreign Application Priority Data

Jun. 22, 2017 (DE) .................. 10 2017 210 459

(51) Int. Cl.
*B81B 7/00* (2006.01)

(52) U.S. Cl.
CPC .......... *B81B 7/0038* (2013.01); *B81B 7/0041* (2013.01); *B81B 2203/0315* (2013.01); *H01L 2224/05166* (2013.01); *H01L 2924/1461* (2013.01)

(58) Field of Classification Search
CPC ... H01L 2924/1461; H01L 2224/05166; B81B 7/0038; B81B 7/007; B81B 7/0058
See application file for complete search history.

(56) References Cited

U.S. PATENT DOCUMENTS

| 7,318,912 | B2* | 1/2008 | Pezzuto | B01F 5/0471 137/1 |
| 9,389,158 | B2* | 7/2016 | Angelescu | E21B 47/02 |
| 2008/0049386 | A1* | 2/2008 | Pornin | B81C 1/00285 361/820 |
| 2012/0326248 | A1 | 12/2012 | Daneman et al. | |
| 2013/0087933 | A1* | 4/2013 | Pornin | B81C 1/00285 257/789 |
| 2016/0025583 | A1* | 1/2016 | Besling | G01L 9/12 73/724 |

FOREIGN PATENT DOCUMENTS

| DE | 60207708 T2 | 9/2006 |
| DE | 102013222517 A1 | 5/2015 |
| DK | 1412550 A1 | 4/2004 |
| EP | 1410433 A2 | 4/2004 |
| EP | 1869696 A1 | 12/2007 |
| WO | 01/94823 A1 | 12/2001 |
| WO | 2006109343 A2 | 10/2006 |
| WO | 03009317 A2 | 1/2013 |
| WO | 03009318 A2 | 1/2013 |

* cited by examiner

*Primary Examiner* — Julio J Maldonado
*Assistant Examiner* — John M Parker
(74) *Attorney, Agent, or Firm* — Norton Rose Fulbright US LLP; Gerard Messina

(57) ABSTRACT

A micromechanical device having a first cavity, which has a MEMS element, and having a second cavity. The second cavity is connected to the first cavity with a connection channel, the connection channel having a seal by which the first cavity and the second cavity are hermetically sealed from each other, the seal being able to be opened electrically.

15 Claims, 5 Drawing Sheets

MICROMECHANICAL DEVICE HAVING A FIRST CAVITY AND A SECOND CAVITY

FIELD OF THE INVENTION

The present invention is based on a micromechanical device having a first cavity, which has an MEMS element, and a second cavity.

BACKGROUND INFORMATION

MEMS elements require a defined environment in order to function properly. This pertains especially to the surrounding pressure. Rotation-rate sensors, in particular, but also other sensors require a low surrounding pressure that remains stable across the service life of the sensor regardless of environmental influences.

According to the related art, a getter material may be used to adjust the pressure in the cavity of a sensor. This is advantageous especially if multiple sensors having different cavity pressures are to be produced on one chip, e.g., a combo element made up of an acceleration and a rotation-rate sensor. In this case, a getter material is introduced into the cavity of the sensor featuring a lower pressure, e.g., the rotation-rate sensor. This is disadvantageous insofar as the activation of the getter takes place thermally during the bonding process. As a result, no separate optimization of the bonding process and the getter activation is possible.

Another possibility consists of using the getter as a stabilizer of the cavity pressure across the service life. For this purpose a getter material is introduced into a cavity, in which case the task of the getter is restricted to the adsorption of gas emissions from the sensor and/or the cap. Here, too, the getter material is thermally activated.

Essential getter materials and methods for their production are discussed in the documents EP1410433, EP1412550 and EP1869696, for example.

SUMMARY OF THE INVENTION

An objective of the present invention consists of providing a micromechanical device having a cavity whose atmospheric internal pressure is able to be controlled.

The present invention is based on a micromechanical device having a first cavity, which has an MEMS element, and a second cavity.

An aspect of the present invention is that the second cavity is connected to the first cavity with the aid of a connection channel, the connection channel having a seal by which the first cavity and the second cavity are hermetically sealed from each other, the seal being able to be opened electrically.

An advantageous embodiment of the present invention provides that the second cavity includes a getter material. The sorption of gases is advantageously able to be increased in that a suitable getter material is additionally introduced into the second cavity, the getter material differing from a wall material of the second cavity. In a particularly advantageous manner, the getter material is situated on an inner surface of the second cavity where is forms a coating.

An advantageous embodiment of the present invention provides that the second cavity has patterning on an inner surface. This advantageously allows for an enlargement of the inner surface on which a sorption of gases is able to take place.

An advantageous embodiment of the present invention provides that the micromechanical device has a main-extension plane and that the first cavity and the second cavity are situated in an at least partially overlapping manner in a direction perpendicular to the main-extension plane. In this way the base area of the micromechanical device is advantageously able to be kept small in the main-extension plane.

An advantageous embodiment of the present invention provides that the micromechanical device has a main-extension plane as well as a bonding frame and a cap parallel to the main-extension plane and that the bonding frame and the second cavity are disposed in an at least partially overlapping fashion in a direction perpendicular to the main-extension plane. This, too, advantageously makes it possible to keep the base area of the micromechanical device small in the main-extension plane in that the otherwise unused space under the bonding frame forms a volume for the second cavity.

This invention allows for the adjustment of a cavity pressure through the use of an electrically activatable getter. The present invention may also be used to stabilize a cavity pressure across the service life, e.g., when the cavity pressure is adjusted with the aid of a laser reseal and pressure changes due to gas emissions from the sensor or also from the cap are to be eliminated. This is realizable because the adjustment of the internal pressure using a gas (e.g., N2, Ar) other than the gas (e.g., H2) that is escaping from the sensor and/or the cap is possible. In this context, the selectivity of the getter material with regard to different gases is exploited. As an alternative, a plurality of cavities may be used, which are additionally connected if required.

From the technical point of view, the present invention offers far-reaching possibilities for adjusting the internal pressure in cavities and also for stabilizing it across the service life. This is achieved in that a getter material is used that is not thermally activated but rather electrically.

The essential advantages are found in the decoupling of the getter activation from further process steps, in particular from the bonding process of the sensor and the cap.

DETAILED DESCRIPTION

Figure 1A:
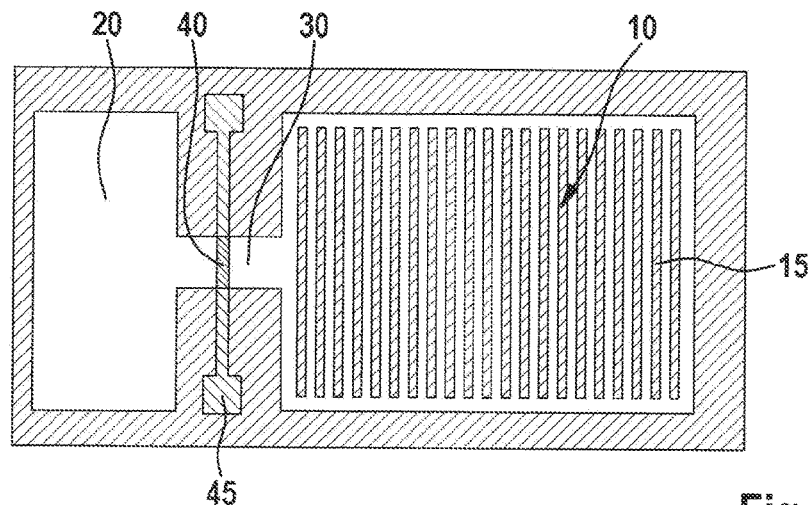
FIGS. 1a, 1b, and 1c show a micromechanical device according to the present invention in a first exemplary embodiment.

The present invention uses an electrical activation of the getter by a change in a diffusion barrier (hereinafter referred to as "seal") between at least two cavities. In addition to a first cavity, in particular a sensor cavity, at least one second cavity is set up for the getter. The second cavity, i.e. the getter cavity, is sealed and has a lower internal pressure than the first cavity, i.e. the sensor cavity. The sensor cavity is connected to the getter cavity via at least one connection channel, which is sealed, however. The seal of this connection channel is connected to electrical contacts so that a current is able to flow across this seal when an external voltage is applied. If a sufficiently large current is flowing through the seal, then the seal heats up and changes its property as a diffusion barrier. This may happen through an opening of the seal due to a deformation, for instance. Such a deformation opens the channel so that the sensor cavity and the getter cavity are then connected to each other.

However, the structure of the seal may also change in such a way that the seal is no longer effective as a diffusion barrier between the sensor cavity and the getter cavity. For example, this is realized in that the seal changes its porosity due to the application of a current.

Semiconductor materials in a monocrystalline, polycrystalline or amorphous form, e.g., silicon or germanium, as well as metals such as aluminum may be used as the material for the seal. Polysilicon is used if possible.

It is also possible to connect a plurality of getter cavities to a sensor cavity using independent seals. In this case, when a pressure increase is detected in the sensor cavity, the pressure in the sensor cavity of the sensor element is able to be reduced by opening a seal to a getter cavity. If multiple getter cavities are interconnected to a sensor cavity with the aid of independent seals, then the individual getter cavities are able to be connected to the sensor cavity, individually and temporally independently, by opening the respective seal. This may improve the stability of a sensor element across the service life. The detection of the internal pressure of the sensor element and the opening of a getter seal are carried out by the evaluation ASIC, which is present independently of this functionality for the purpose of evaluating the sensor signals.

The getter cavity may be integrated into the sensor element in a surface-neutral manner. This is possible by placing the getter cavity completely or partially under the bonding frame, see the detailed description below.

Realization possibilities using one sensor cavity, a plurality of connection channels and a plurality of getter cavities are illustrated in FIGS. 1 through 4. The volume ratio between getter cavity and sensor cavity may be less than one, greater than one or equal to one. FIGS. 1 through 4 show the volume ratio of getter cavity to sensor cavity as less than one in each case by way of example.

Figure 1B:
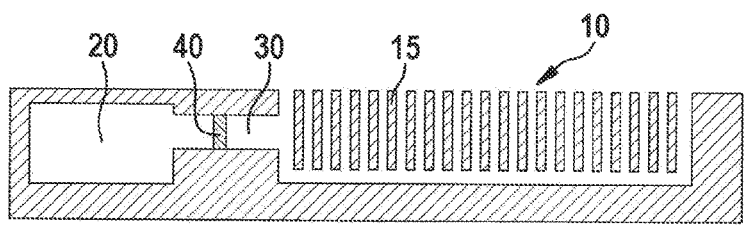
Figure 1C:
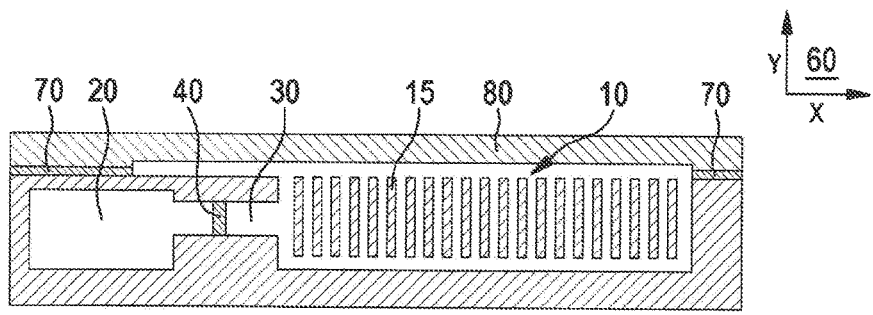

FIG. 1a through c show a micromechanical device according to the present invention in a first exemplary embodiment. FIG. 1a shows a plan view of a micromechanical device according to the present invention having a first cavity 10, which includes an MEMS element 15, and a second cavity 20. The two cavities are hermetically sealed from the environment. The MEMS element requires a certain work pressure. Second cavity 20 is connected to first cavity 10 with the aid of a connection channel 30. Connection channel 30 has a seal 40, which hermetically seals first cavity 10 and second cavity 20 from each other. Seal 40 is able to be opened electrically and includes electrical contactings 45 for this purpose. The second cavity is able to function as a getter for the first cavity in that it has a lower internal pressure than the first cavity prior to the opening of the seal. In addition, the inner surfaces of the second cavity act as a getter for an adsorption of the gases. FIG. 1b shows the micromechanical device in a cross-section with a first cavity 10, a second cavity 20, and a sealed connection channel 30 including a seal 40, prior to the mounting of a cap 80 for sealing the cavities.

FIG. 1c shows a cross-section of the finished micromechanical device after cap 80 has been applied in order to seal cavities 10, 20. The micromechanical device has a main-extension plane 60. First cavity 10 and second cavity 20 are situated in a partially overlapping manner in a direction perpendicular to main-extension plane 60. First cavity 10 extends underneath cap 80 across and beyond the region of connection channel 30 and partially across second cavity 20. With the aid of a bonding frame 70, cap 80 is connected to the remaining micromechanical device in a plane parallel to main-extension plane 60. Bonding frame 70 and second cavity 20 are disposed in a partially overlapping manner in a direction perpendicular to main-extension plane 60.

Figure 2:
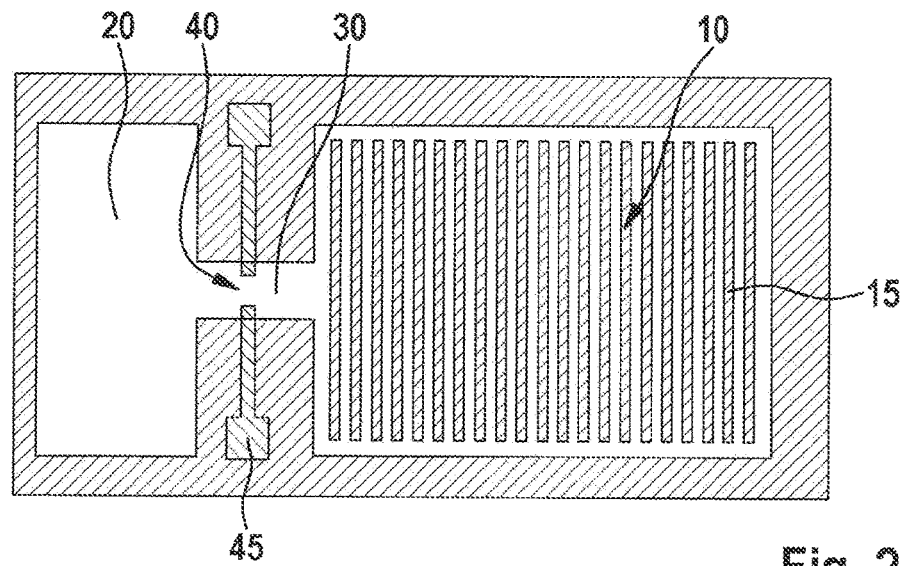
FIG. 2 shows a micromechanical device according to the present invention with an open seal.

FIG. 2 shows a micromechanical device according to the present invention with an open seal. Shown is a plan view of a micromechanical device according to the present invention with a connection channel 40 that is open after a current flow has taken place.

Figure 3:
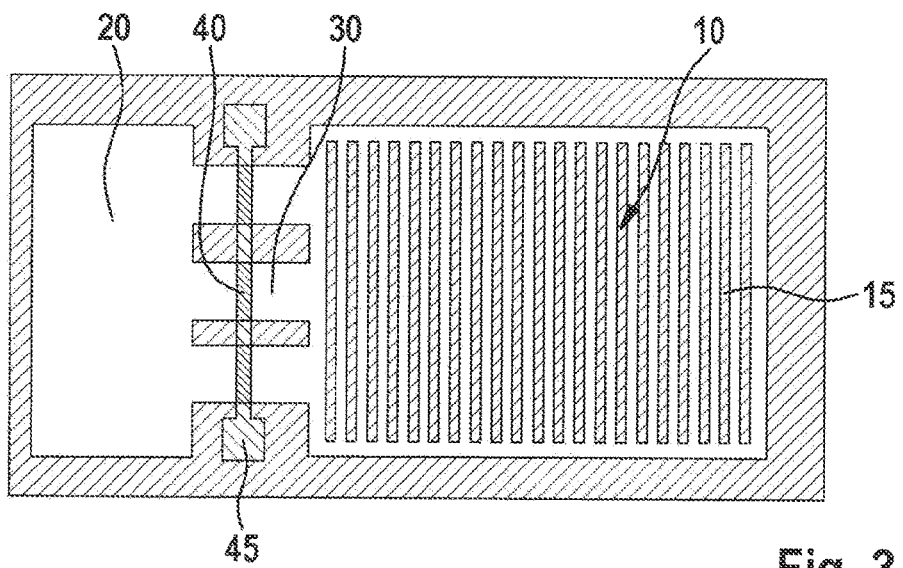
FIG. 3 shows a second exemplary embodiment of a micromechanical device according to the present invention including three connection channels and three seals.

FIG. 3 shows a second exemplary embodiment of a micromechanical device according to the present invention with three connection channels 30 and three closed seals 40 by way of example.

Figure 4:
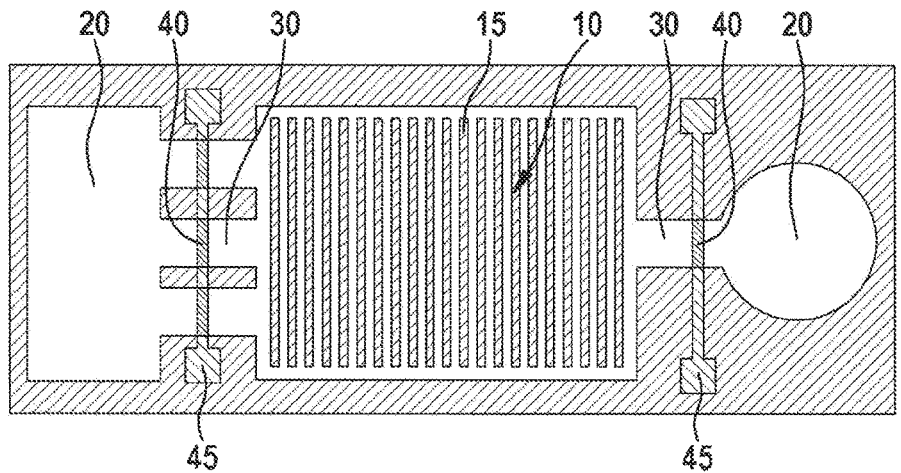
FIG. 4 shows a third exemplary embodiment of a micromechanical device according to the present invention having a first cavity and two second cavities.

FIG. 4 shows a third exemplary embodiment of a micromechanical device according to the present invention, with a first cavity 10 and two second cavities 20. The plan view shows two second cavities 20 having different geometries, a first cavity 10, and a plurality of sealed connection channels 30.

Second cavity 20 itself may include further patternings in order to increase the sorption capacity. Porous surfaces, in particular, are able to increase the surface and improve the sorption capacity as a result. The getter material in second cavity 20, i.e. the getter cavity, may be made from different materials as well as combinations thereof. Particularly suitable is silicon since it is uncomplicated in the production and is available through the process flow used for the sensor element. In addition, the getter cavity and its patterning may be coated with a getter material in order to increase the sorption capacity. Realization possibilities are illustrated in FIGS. 5 and 6.

Figure 5:
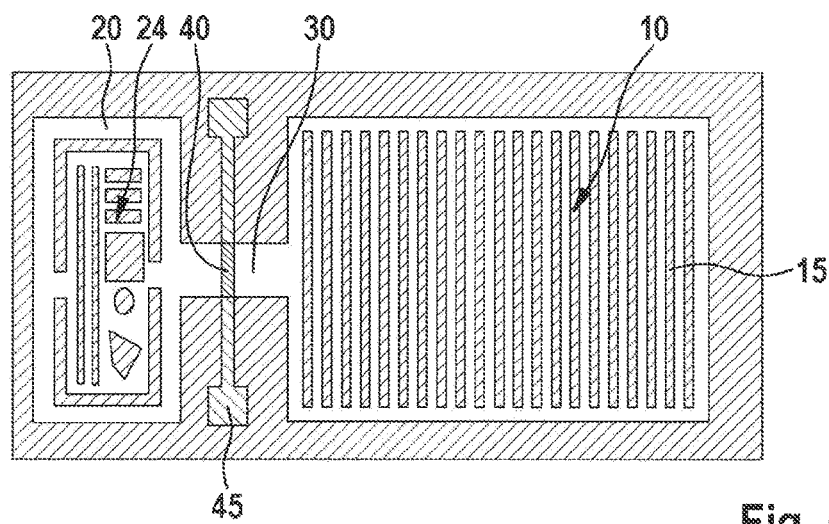
FIG. 5 shows a fourth exemplary embodiment of a micromechanical device according to the present invention having patterning of an inner surface of the second cavity.

FIG. 5 shows a fourth exemplary embodiment of a micromechanical device according to the present invention, including patterning 24 of an inner surface of second cavity 20.

Figure 6:
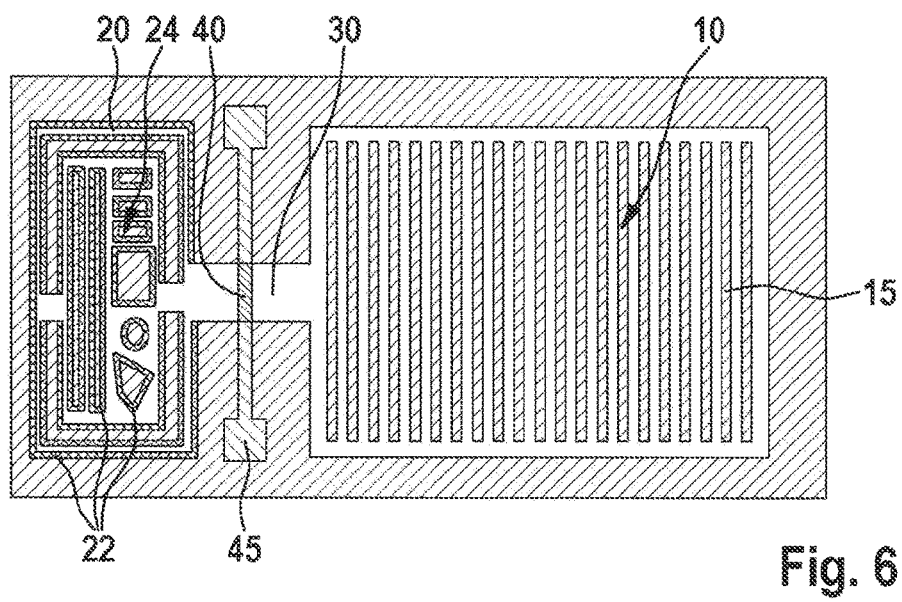
FIG. 6 shows a fifth exemplary embodiment of a micromechanical device according to the present invention having a second cavity, which includes a getter material.

FIG. 6 shows a fifth exemplary embodiment of a micromechanical device according to the present invention with a second cavity, which includes a getter material 22. In this particular example, the feature of a patterning 24 of an inner surface of second cavity 20 is realized in addition.

In order not to enlarge the micromechanical device by the second cavity or to enlarge it only as minimally as possible, second cavity 20 may be partially or completely placed under bonding frame 70. This is possible because the bonding frame has a width of multiple 10 μm. When second cavity 20 is shifted under bonding frame 70, this otherwise unused region is able to be used for the second cavity.

Figure 7A:
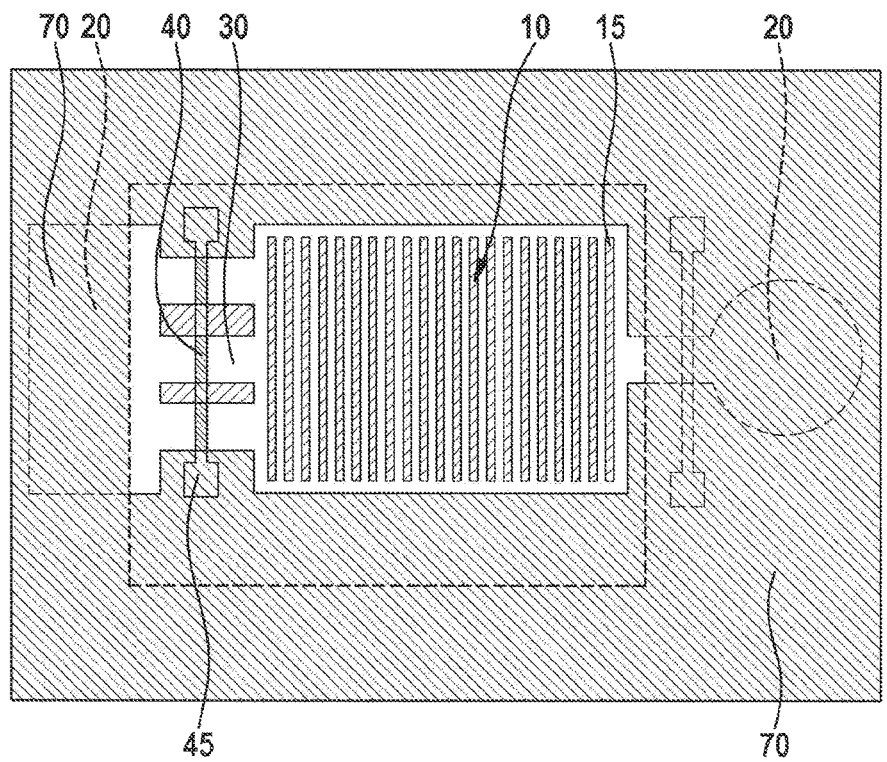
FIGS. 7a and 7b show a sixth exemplary embodiment of a micromechanical device according to the present invention having two second cavities, which are at least partially disposed under a bonding frame.

FIGS. 7a and b show a sixth exemplary embodiment of a micromechanical device according to the present invention with two second cavities 20, which are at least partially disposed under a bonding frame 70. In a plan view, FIG. 7a shows a micromechanical device having a second cavity 20, which is partially disposed under bonding frame 70 (left), and including a further second cavity 20, which is completely disposed under bonding frame 70 (right).

Figure 7B:
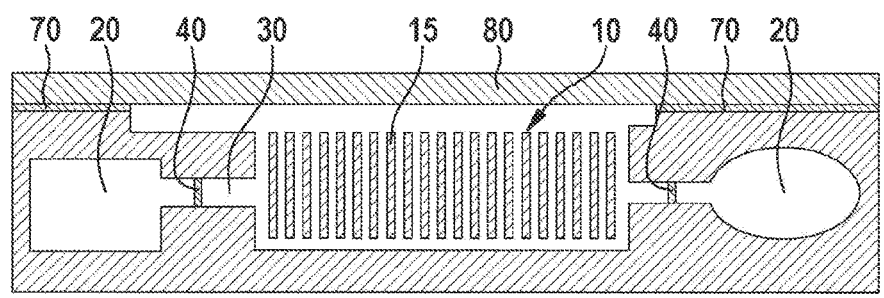

FIG. 7b shows the micromechanical device in a cross-section. Second cavity 20 may also be disposed circumferentially around first cavity 10.

The List of Reference Numerals is as follows:
10 first cavity
15 MEMS element
20 second cavity
22 getter material
24 patterning of an inner surface of the second cavity
30 connection channel
40 seal
45 electrical contacting
60 main-extension plane
70 bonding frame
80 cap

What is claimed is:

1. A micromechanical device, comprising:
   a first cavity, which has an MEMS element; and
   a second cavity, wherein the second cavity is connected to the first cavity with a connection channel;
   wherein the connection channel includes a seal by which the first cavity and the second cavity are hermetically sealed from each other, and
   wherein the seal is openable electrically.

2. The micromechanical device of claim 1, wherein the second cavity includes a getter material.

3. The micromechanical device of claim 1, wherein the second cavity has a patterning of an inner surface.

4. The micromechanical device of claim 1, wherein the first cavity and the second cavity are disposed in an at least partially overlapping manner in a direction perpendicular to a top or bottom surface of a substrate containing the first and second cavities.

5. The micromechanical device of claim 1, wherein the micromechanical device has a bonding frame and a cap, wherein the bonding frame and the second cavity are disposed in an at least partially overlapping manner in a direction perpendicular to a top or bottom surface of the cap.

6. The micromechanical device of claim 1, further comprising a getter material coated onto a surface of the second cavity.

7. The micromechanical device of claim 1, further comprising a getter material deposited onto a patterning of an inner surface of the second cavity.

8. The micromechanical device of claim 1, further comprising a bonding frame and a cap, wherein the second cavity is disposed at least partially under the bonding frame.

9. The micromechanical device of claim 1, further comprising electrical contacts to the seal to enable a current to flow across the seal when a voltage is applied to the contacts, wherein in response to the current reaching at least predetermined magnitude, the seal heats up to transition from hermetically sealing the first and second cavities from each other to allowing communication of gases between the first and second cavities.

10. The micromechanical device of claim 1, further comprising electrical contacts to the seal to enable a current to flow across the seal when a voltage is applied to the contacts, wherein in response to the current reaching at least predetermined magnitude, the seal opens due to a deformation.

11. The micromechanical device of claim 1, further comprising electrical contacts to the seal to enable a current to flow across the seal when a voltage is applied to the contacts, wherein in response to the current reaching at least predetermined magnitude, the seal changes its porosity to allow communication of gases between the first and second cavities.

12. The micromechanical device of claim 1, wherein the seal includes at least one of: silicon, or germanium.

13. The micromechanical device of claim 1, wherein the seal includes aluminum.

14. The micromechanical device of claim 1, wherein the seal includes polysilicon.

15. The micromechanical device of claim 1, further comprising:
   a third cavity, wherein the third cavity is connected to the first cavity with an additional connection channel;
   wherein the additional connection channel includes an additional seal by which the first cavity and the third cavity are hermetically sealed from each other, and
   wherein the additional seal is openable electrically independently of the seal.

* * * * *